(12) United States Patent
Floyd

(10) Patent No.: US 6,198,312 B1
(45) Date of Patent: Mar. 6, 2001

(54) LOW LEVEL INPUT VOLTAGE COMPARATOR

(75) Inventor: Brian H. Floyd, Sunnyvale, CA (US)

(73) Assignee: Impala Linear Corporation, San Jose, CA (US)

( * ) Notice: Subject to any disclaimer, the term of this patent is extended or adjusted under 35 U.S.C. 154(b) by 0 days.

(21) Appl. No.: 09/442,294

(22) Filed: Nov. 19, 1999

(51) Int. Cl.[7] ............................. H03K 5/22; H03K 5/153
(52) U.S. Cl. ................................................. 327/77
(58) Field of Search ............................. 327/77, 78, 80, 327/81, 87

(56) References Cited

U.S. PATENT DOCUMENTS

| | | | |
|---|---|---|---|
| 5,731,721 | * 3/1998 | Gantioler et al. | 327/81 |
| 5,834,954 | * 11/1998 | Tihanyi | 327/77 |
| 6,057,712 | * 5/2000 | Heil et al. | 327/77 |

OTHER PUBLICATIONS

G. Tzanateas, C.A.T. Salama and Y.P. Tsividis, "A CMOS Bandgap Voltage Reference," *IEEE Journal of Solid–State Circuits*, vol. SC–14, No. 3 (Jun. 1979), pp. 655–657.

* cited by examiner

Primary Examiner—Terry D. Cunningham
Assistant Examiner—Quan Tra
(74) Attorney, Agent, or Firm—Law Offices of Terry McHugh

(57) ABSTRACT

A circuit and a method for comparing an input voltage to an internally generated reference voltage utilize a bias network to make the voltage comparison. The bias network is preferably configured to generate a proportional-to-absolute-temperature (PTAT) reference voltage, which is used for the voltage comparison. Although the circuit can be implemented to operate in a number of applications, the circuit is particularly useful in a current sensing application. The circuit includes the bias network, a comparison current path and an output terminal. The comparison current path is configured to partially duplicate a current path of the bias network on which the reference voltage is generated. The comparison current path includes a current control element and an active transistor. Depending on the input voltage applied to the active transistor of the comparison current path, the output terminal is driven to generate either a high or a low comparison signal. In a first embodiment, the circuit is configured to sense voltages near the supply voltage. In a second embodiment, the circuit is configured to sense voltages near the electrical ground. In either embodiments, the circuit requires a startup circuit to initiate the bias network into a conducting state.

25 Claims, 6 Drawing Sheets

LOW LEVEL INPUT VOLTAGE COMPARATOR

TECHNICAL FIELD

The invention relates generally to circuits and more particularly to a voltage comparator circuit.

BACKGROUND ART

Voltage comparators are useful circuit blocks that can be implemented to operate in a wide variety of applications. For example, voltage comparators may be utilized to detect zero crossings of an arbitrary signal waveform. As another example, voltage comparators may be utilized to convert sine waves into square waves. Voltage comparators can also be used in current sensing applications by monitoring the voltage at a specified node of a circuit.

A block diagram of a conventional voltage comparator 10 is shown in FIG. 1. The voltage comparator includes inputs 12 and 14 and an output 16. The input 12 is configured to receive an input voltage $V_i$, while the input 14 is configured to receive a reference voltage $V_r$. The reference voltage $V_r$ constitutes the comparator threshold. In operation, if the input voltage $V_i$ is greater than the reference voltage $V_r$, the voltage comparator provides a high level signal $V_{o+}$ on the output. Alternatively, if the input voltage $V_i$ is less than the reference voltage, the voltage comparator provides a low level signal $V_{o-}$ on the output.

The transfer characteristics of the voltage comparator 10 are illustrated in FIG. 2. The plot 18 of FIG. 2 is the voltage on the output 16 of the voltage comparator with changes to the input voltage $V_i$. When $V_i<V_r$, the voltage on the output is the low level signal $V_{o-}$. However, when $V_{i>Vr}$, the voltage on the output is the high level signal $V_{o+}$. For a zero crossing detection application, the reference voltage $V_r$ equals zero voltage. In other applications, however, the reference voltages can be other than zero voltage. For a wave conversion application, the high level signal $V_{o+}$ and the low level signal $V_{o-}$ are selectively set to produce the desired square wave.

Conventional voltage comparators, as illustrated by the voltage comparator 10 of FIG. 1, may operate well for their intended purposes. However, when the input voltage to be compared is very close to the reference voltage (e.g., supply voltage or the electrical ground), these conventional voltage comparators may not function as designed. In light of this concern, what is needed is a voltage comparator that can operate properly even when the input voltage is in the order of millivolts with respect to the reference voltage, such as the supply voltage or the electrical ground.

SUMMARY OF THE INVENTION

A circuit and a method for comparing an input voltage to an internally generated reference voltage utilize a bias network to make the voltage comparison. The bias network is preferably configured to generate a proportional-to-absolute-temperature (PTAT) reference voltage, which is used for the voltage comparison. Although the circuit can be implemented to operate in a number of applications, the circuit is particularly useful in a current sensing application. The circuit can be configured to accurately sense voltages near the supply voltage or the electrical ground.

In a first embodiment, the circuit is configured to sense input voltages that are near the supply voltage. The circuit includes the bias network and a comparison current path. The bias network includes a resistor, a first p-type metal-oxide semiconductor (PMOS) transistor and a first n-type metal-oxide semiconductor (NMOS) transistor that are connected in series between a high voltage terminal and a low voltage terminal to form a first current path. The bias network also includes a second PMOS transistor and a second NMOS transistor that are connected in series between the high voltage terminal and the low voltage terminal to form a second current path. The high voltage terminal may provide the supply voltage. The low voltage terminal may be grounded.

In this embodiment, the NMOS transistors of the bias network are of the same size and connected as a current mirror to source the same current level to the PMOS transistors of the bias network. However, the size of the first PMOS transistor on the first current path is M times the size of the second PMOS transistor on the second current path. In a preferred embodiment, the resistor on the first current path provides sufficient electrical resistance so that the PMOS transistors operate in a sub-threshold region to generate the PTAT reference voltage. The reference voltage is generated on the first current path of the bias network, such that the voltage on the source of the first PMOS is the reference voltage.

The comparison current path of the circuit includes a third PMOS transistor and a third NMOS transistor that are connected in series between an input voltage terminal and the low voltage terminal. The sizes of the third PMOS transistor and the third NMOS transistors of the comparison current path are same as the sizes of the first PMOS transistor and the first NMOS transistors, respectively, on the first current path of the bias network. The gate of the third PMOS transistor is coupled to the gate of the first PMOS transistor, while the gate of the third NMOS transistor is coupled to the gate of the first NMOS transistor. An output terminal is connected to the comparison current path between the third PMOS transistor and the third NMOS transistor. The output terminal provides a comparison signal that is indicative of the comparison of the input voltage to the reference voltage.

When the input voltage applied to the input voltage terminal of the comparison current path is equivalent to the generated reference voltage, the conditions on the third PMOS transistor and the third NMOS transistor of the comparison current path are equivalent to the conditions on the first PMOS transistor and the first NMOS transistor of the first current path of the bias network with respect to currents and voltages. However, if the input voltage is greater than the reference voltage, the $v_{gs}$ of the third PMOS transistor is greater than the $v_{gs}$ of the first PMOS transistor, which results in a high signal on the output terminal. Conversely, if the input voltage is less than the reference voltage, the $v_{gs}$ of the third PMOS transistor is less than the $v_{gs}$ of the first PMOS transistor, which results in a low signal on the output terminal. Thus, the third PMOS transistor functions as an active device to drive the output terminal, either high or low, in response to the input voltage.

In a second embodiment, the circuit is configured to sense input voltages that are near the electrical ground. In this embodiment, the comparison circuit is connected between the high voltage terminal and the input voltage terminal. In addition, the PMOS transistors of the bias network are of the same size and are configured as a current mirror to source the same amount of current to the NMOS transistors of the bias network, while the NMOS transistors of the bias network have sizes that are proportional to each other. Consequently, the NMOS transistor on the second current path of the comparison current path functions as the active device to drive the output terminal, either high or low, in response to the input voltage.

In either embodiments, the circuit requires a startup circuit to initiate the bias network to conduct current through the first and second current paths. In effect, the startup circuit changes the operating state of the bias network from a non-conducting stable state to a conducting stable state. An exemplary startup circuit for the first embodiment includes a start transistor that is coupled to the NMOS transistors of the bias network that are functioning as a current mirror. The activation of the start transistor turns on the NMOS transistors of the bias network to a conducting state, thereby allowing current to conduct through the first and second current path of the bias network. The exemplary startup circuit also includes a shut-off transistor that is connected to the first current path of the bias network. The shut-off transistor operates to deactivate the start transistor after current is drawn through the first current path of the bias network. Thus, the startup circuit automatically deactivates itself after initiating the bias network.

DETAILED DESCRIPTION

Figure 1:
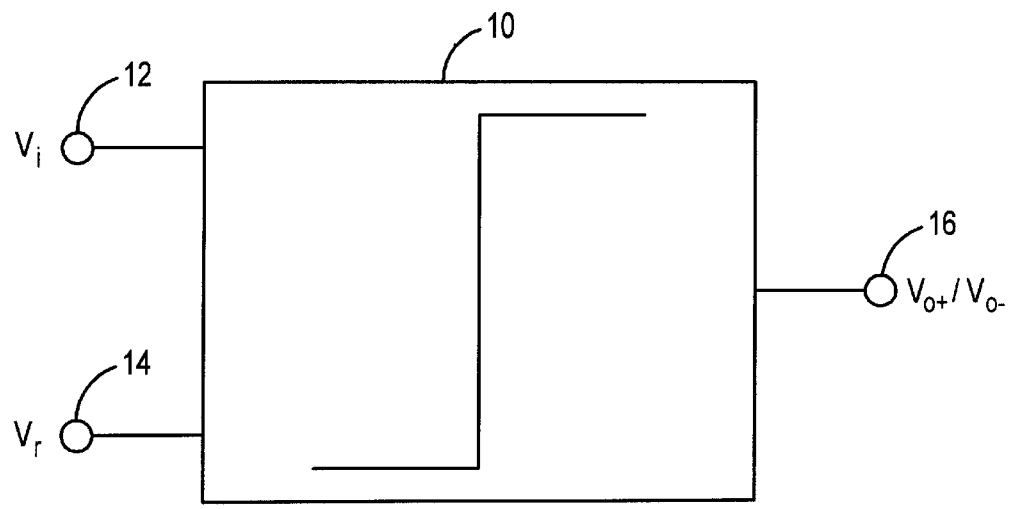
FIG. 1 is a block diagram of a conventional voltage comparator having two inputs and an output.
Figure 2:
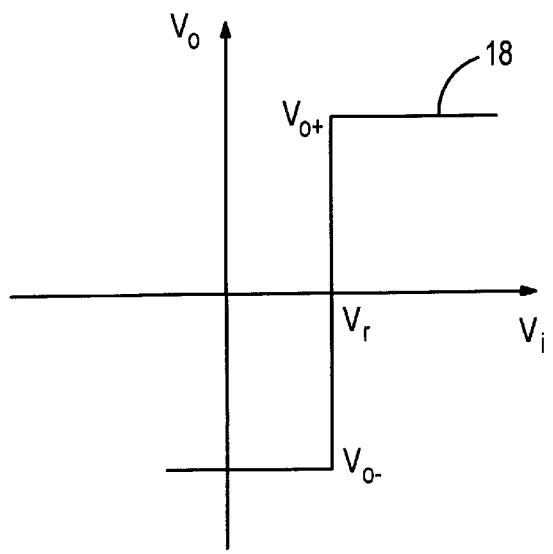
FIG. 2 is a plot of voltages on the output of the voltage comparator of FIG. 1 with respect to applied input voltages.
Figure 3:
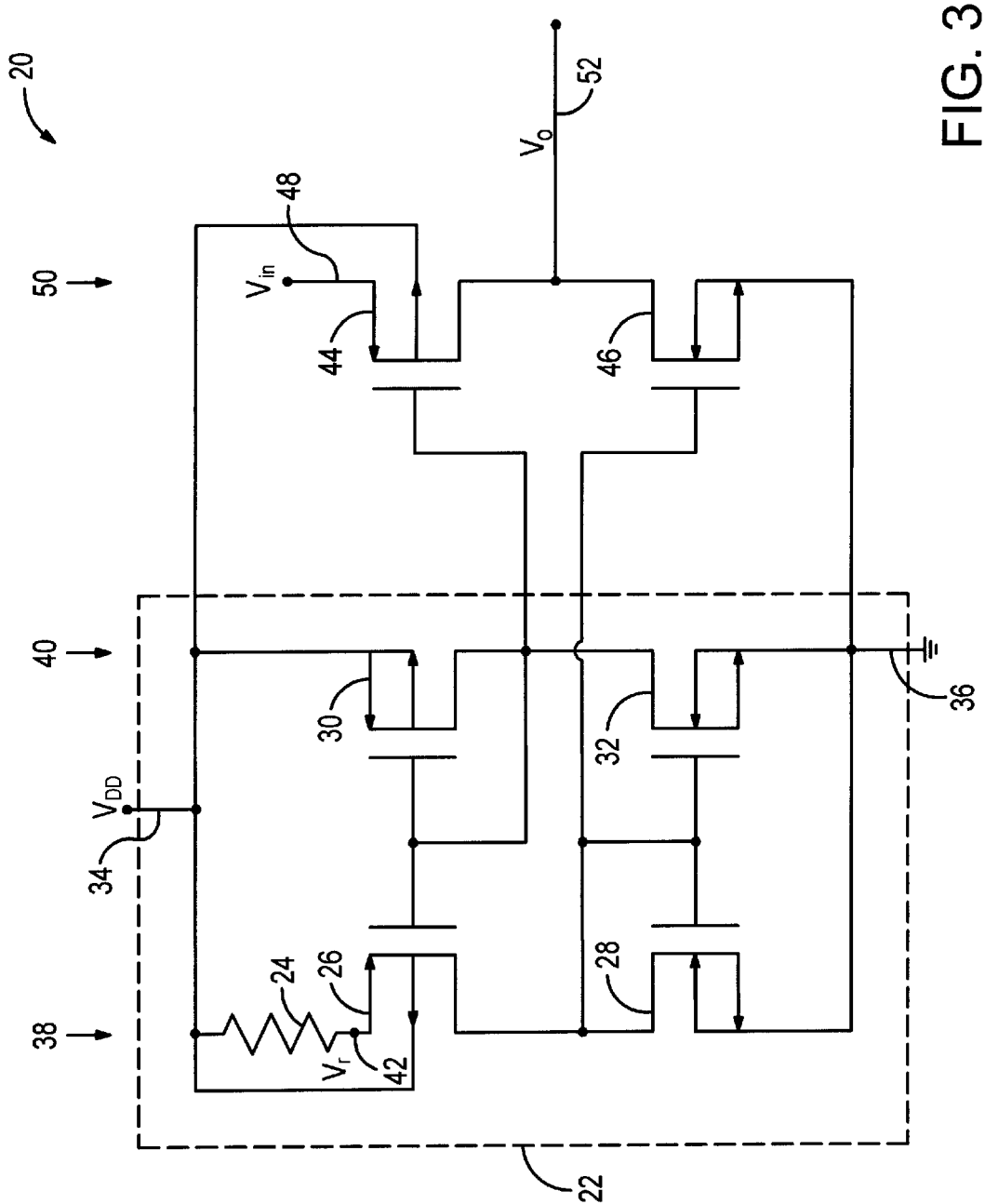
FIG. 3 is a schematic diagram of a voltage comparator in accordance with a first embodiment of the present invention.

With reference to FIG. 3, a voltage comparator 20 in accordance with a first embodiment of the invention is shown. The voltage comparator operates to generate either a high or a low signal in response to a comparison of an input voltage $V_{in}$ to an internally generated reference voltage $V_r$. In this embodiment, the voltage comparator is configured to generate a high signal when the input voltage is greater than the reference voltage, and to generate a low signal when the input voltage falls below the reference voltage. However, the voltage comparator can be configured such that the above correlation between the generated signal and the input voltage is reversed. The voltage comparator can be utilized for a number of different applications. As an example, the voltage comparator may be utilized for current sensing applications. In this embodiment, the voltage comparator is designed to compare an input voltage that is very close to the supply voltage.

The voltage comparator 20 includes a complementary metal-oxide semiconductor (CMOS) bias network 22 that generates the reference voltage $V_r$. The bias network is comprised of a resistor 24 and four transistors 26, 28, 30 and 32. The resistor and transistors 26 and 28 are connected in series between a high voltage terminal 34 and a low voltage terminal 36 to form a first current path 38. The high voltage terminal is electrically connected to a supply voltage $V_{DD}$.

In this configuration, the low voltage terminal is grounded. The transistors 30 and 32 of the bias network are also connected in series between the high voltage terminal and the low voltage terminal to form a second current path 40. The transistors 26 and 30 are p-type metal-oxide semiconductor (PMOS) transistors, while the transistors 28 and 32 are n-type metal-oxide semiconductor (NMOS) transistors. The NMOS transistors are of the same size and are configured as a current mirror to sink the same amount of current through their respective current paths. However, the PMOS transistors are fabricated to have a 1:M ratio with respect to their sizes. That is, the PMOS transistor 26 of the current path 38 is M times the size of the PMOS transistor 30 of the current path 40. The gates of PMOS transistors are also connected to each other.

In operation, the CMOS bias network 22 preferably generates a proportional to absolute temperature (PTAT) reference voltage $V_r$ at node 42, which is located on the first current path 38. In order to generate the PTAT reference voltage, the resistor 24 must be sufficiently large so that the PMOS transistors 26 and 30 are operating in a sub-threshold region. When the PMOS transistors are operating in the sub-threshold region, the CMOS bias network creates the PTAT voltage $V_r$, which can be derived from the following equation.

$$V_{DD}-V_r=kT/q*lnM,$$

where k is the Boltzmann's constant, T is the absolute temperature, q is the electronic charge, and M is the scale factor of the PMOS transistor 26 to the PMOS transistor 30. This method of generating the PTAT voltage $V_r$ using a MOSFET/resistor loop is known. For example, such a method is described by G. Tzanateas, C. A. T. Salama and Y. P. Tsividis in "A CMOS Bandgap Voltage Reference," *IEEE Journal of Solid-State Circuits*, Vol. SC-14, No. 3 (June 1979), pages 655–657.

The voltage comparator 20 further includes a PMOS transistor 44 and an NMOS transistor 46 that are connected in series between an input voltage terminal 48 and the low voltage terminal 36 to form a comparison current path 50. The gate of PMOS transistor 44 is coupled to the gate of the PMOS transistor 26 on the first current path 38. Similarly, the gate of NMOS transistor 46 is coupled to the gate of the NMOS transistor 28 on the first current path 38. Connected between the PMOS transistor 44 and the NMOS transistor 46 is an output terminal 52, on which a comparison signal $V_o$ is produced.

The fundamental concept of the voltage comparator 20 is to create a current path, i.e., the comparison current path 50, that duplicates the first current path 38 of the CMOS bias network 22. Thus, the PMOS transistor 44 and the NMOS transistor 46 on the comparison current path are the same sizes as the PMOS transistor 26 and the NMOS transistor 28, respectively, on the first current path of the CMOS bias network. It can be seen in FIG. 3 that if the input voltage $V_{in}$ at the input voltage terminal 48 on the comparison current path equals the generated PTAT reference voltage $V_r$ on the first current path of the CMOS bias network, the comparison current path would be identical to the first current path from the node 42 to the low voltage terminal 36 with respect to voltage and current conditions. This situation can be viewed as an equilibrium state in which the PMOS transistor 44 of the comparison current path sources an amount of current that is approximately equal to the amount of current that the NMOS transistor 46 of the comparison current path sinks. However, in situations where $V_{in}$ is greater than $V_r$, the voltage across the gate and the source ($v_{gs}$) of the PMOS transistor 44 on the comparison current path is greater than the $v_{gs}$ of the PMOS transistor 26 on the first current path of the CMOS bias network. Since the NMOS transistor 46 of the comparison current path is fixed to sink a particular amount of current, the PMOS transistor 44 sources more current than the amount of current that the NMOS transistor 46 can sink, which drives the output terminal high, i.e., generates a high comparison signal $V_o$ on the output terminal 52. Conversely, in situations where $V_{in}$ is less than $V_r$, the $v_{gs}$ of the PMOS transistor 44 on the output current path will be smaller than the $v_{gs}$ of the PMOS transistor 26 on the first current path of the CMOS bias network. Thus, the PMOS transistors 44 sources less current than the amount of current that NMOS transistor 46 can sink, which drives the output terminal low, i.e., generates a low comparison signal $V_o$ on the output terminal.

Figure 4:
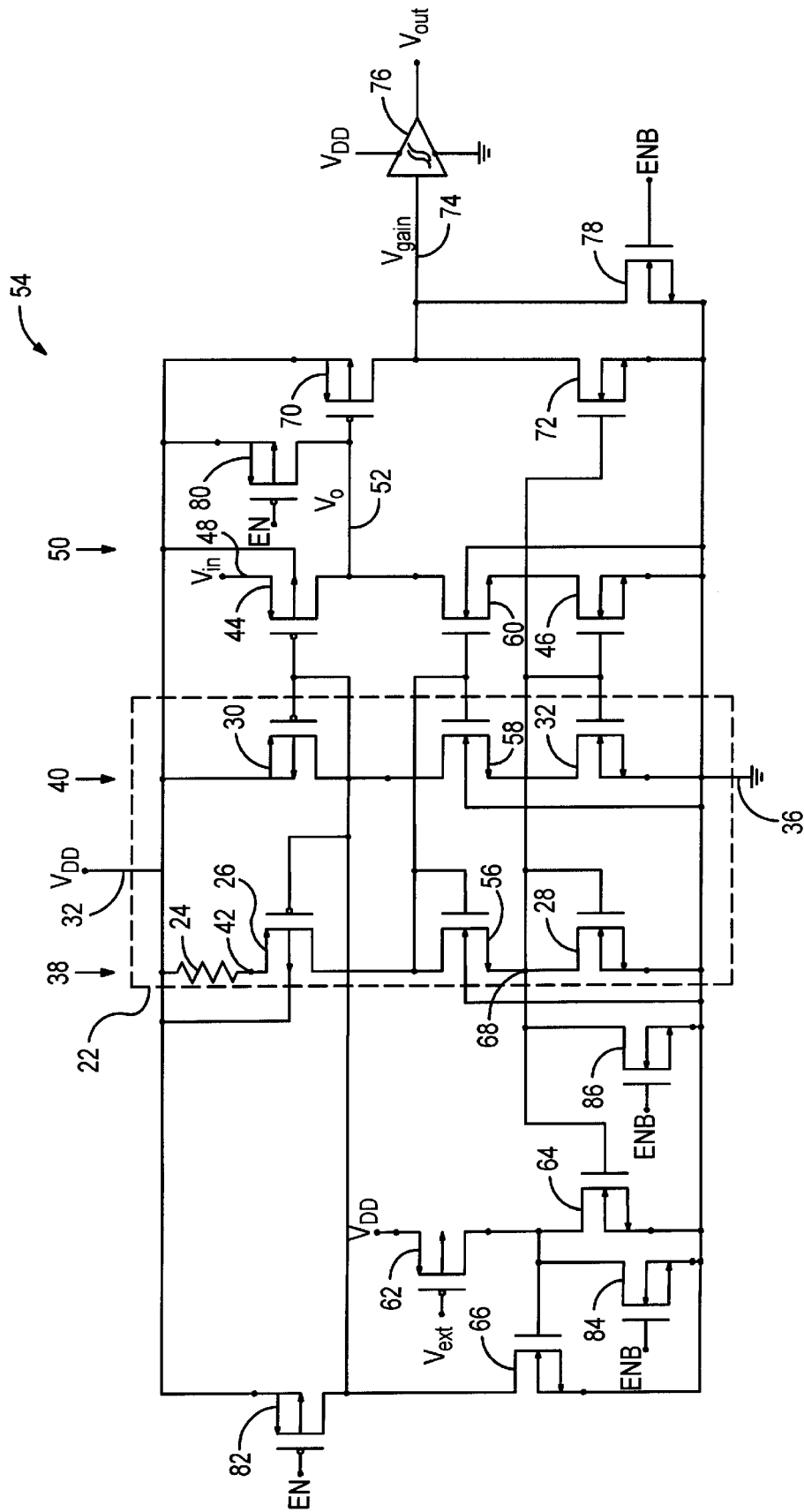
FIG. 4 is a schematic diagram of circuitry that includes the voltage comparator of FIG. 3 and a startup circuit in accordance with the invention.

Turning now to FIG. 4, a schematic diagram of a circuit 54 that utilizes the voltage comparator of FIG. 3 is shown. The circuit includes all of the components of the voltage comparator of FIG. 3. Therefore, reference numerals used in FIG. 3 will be used to identify same components in FIG. 4. The circuit includes the CMOS bias network 22 and the comparison current path 50. However, in contrast to the CMOS bias network 22 and the comparison current path 50 of the voltage comparator 20, as shown in FIG. 3, the CMOS bias network 22 and the comparison current path 50 of the circuit 54 include additional NMOS transistors 56, 58 and 60. These additional transistors operate to cascode the NMOS transistors 28, 32 and 46 to improve the current-mirroring characteristics. The sizes of the PMOS transistors 26, 30 and 44, the NMOS transistors 28, 32, 46, 56, 58 and 60 and the resistor 24 are carefully chosen, so that the PMOS transistors 26, 30 and 44 operate in a sub-threshold region, while the NMOS transistors 28, 32, 46, 56, 58 and 60 substantially operate in a square law region, i.e., above the sub-threshold region.

In addition to the CMOS bias network 22 and the comparison current path 50, the circuit 54 includes a startup circuit and a gain stage circuit. The startup circuit is comprised of a PMOS transistor 62 and two NMOS transistors 64 and 66. The PMOS transistor 62 and the NMOS transistor 64 are connected in series between $V_{DD}$ and the low voltage terminal. The gate of PMOS transistor 62 is connected to an external voltage source $V_{ext}$ that controls the activation of the PMOS transistor 62 to initiate the startup of the circuit 54. The gate of NMOS transistor 64 is coupled to node 68 on the first current path 38 of the CMOS bias network 22. The NMOS transistor 66 of the startup circuit is connected to the gates of PMOS transistors 26 and 30 of the CMOS bias network and the gate of PMOS transistor 44 of the comparison current path 50. The gate of NMOS transistor 66 is coupled to the PMOS transistor 62, such that the activation of the PMOS transistor 62 will turn on the NMOS transistor 66.

The startup circuit operates to activate the circuit 54 to a desired stable state by allowing current to flow through the first and second current paths 38 and 40 of the bias network 22, as well as through the comparison current path 50. In effect, the startup circuit changes the operating state of the bias network from a non-conducting stable state to a conducting stable state. In the non-conducting stable state, the PMOS transistors 26, 30 and 44 are deactivated. Thus, no current is allowed to flow from the high voltage terminal 34 to the low voltage terminal 36, except for leakage current. When a high $V_{ext}$ signal is applied to the gate of PMOS transistor 62, current is allowed to flow to the gate of the NMOS transistor 66 via the PMOS transistor 62. This current charges the gate of the NMOS transistor 66, turning on the NMOS transistor 66. When activated, the NMOS transistor 66 sinks current from the gates of the PMOS transistors 26, 30 and 44, which drives the voltages on the gates of these PMOS transistors low. The result is that the PMOS transistors 26, 30 and 44 are activated to a conducting state, which draws current through the PMOS transistors 26, 30 and 44. The flow of current through the PMOS transistors 26, 30 and 44 turns on the NMOS transistors 56, 58 and 60, and then, the NMOS transistors 28, 32 and 46. Shortly after the NMOS transistors 56, 58 and 60 are activated, the current through the first current path 38 charges the gate of the NMOS transistor 64 of the startup circuit, which turns on the NMOS transistor 64. The activation of the NMOS transistor 64 drives the voltage at the gate of the NMOS transistor 66 low, turning off the NMOS transistor 66. Thus, the startup circuit is configured as a self-terminating circuit.

The gain stage circuit of the circuit 54 is comprised of a PMOS transistor 70 and an NMOS transistor 72 that are connected in series between the high voltage terminal 34 and the low voltage terminal 36. The gate of NMOS transistor 72 is coupled to the gates of NMOS transistors 28, 32 and 46, while the gate of PMOS transistor 70 is coupled to the output terminal 52. The gain stage circuit operates to generate an inverted gained output signal $V_{gain}$ on an intermediate output terminal 74 in response to the $V_o$ signal on the output terminal. Thus, when the $V_o$ signal is low, the $V_{gain}$ signal is high. Similarly, when the $V_o$ signal is high, the $V_{gain}$ signal is low. The intermediate output terminal leads to a Schmitt buffer 76 that functions to provide some hysteresis for noise reduction. The inclusion of the Schmitt buffer is optional, and is not critical to the invention. The output from the Schmitt buffer provides the final output signal $V_{out}$ of the circuit 54.

Figure 5:
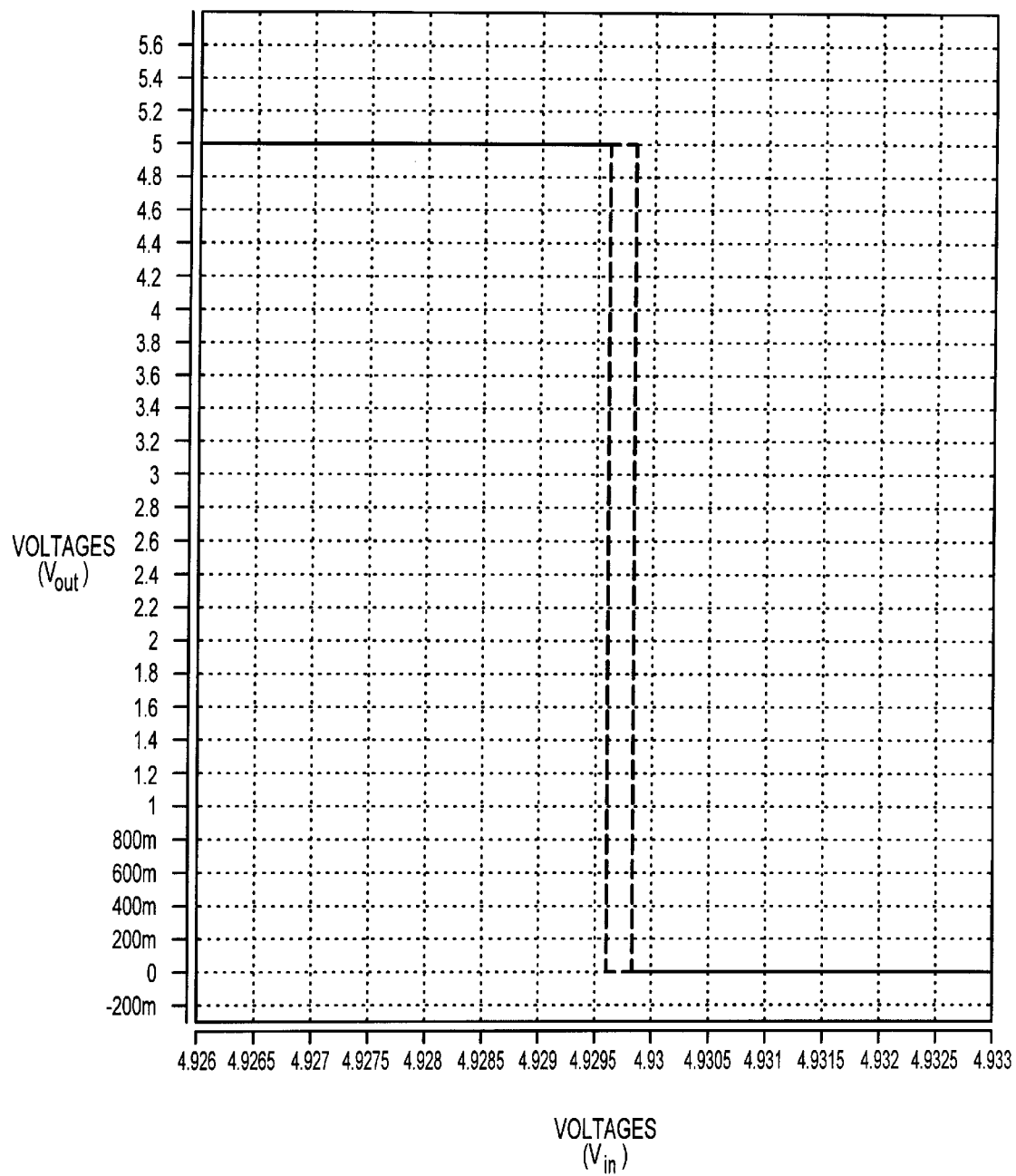
FIG. 5 is a plot of output voltages with respect to applied input voltages for the circuitry of FIG. 4.

The remaining transistors 78, 80, 82, 84 and 86 that are included in the circuit 54 of FIG. 4 operate to put the circuit in an enabled or a disabled state. The disabled state is established by applying high EN signals to the PMOS transistors 80 and 82 and low ENB signals to the NMOS transistors 78, 84 and 86. The high EN signals turn on the PMOS transistors 80 and 82, while the low ENB signals turn on the NMOS transistors 78, 84 and 86. In this disabled state, the transistors 78–86 operate to ensure that no current paths exist from the high voltage terminal 34 to the low voltage terminal 36. In addition, the activated NMOS transistor 78 pulls the intermediate output terminal 74 low, so that the $V_{out}$ is set low. The output characteristics of the circuit are illustrated in the graph of FIG. 5, which is a plot of output voltages $V_{out}$ with respect to input voltages $V_{in}$.

Figure 6:
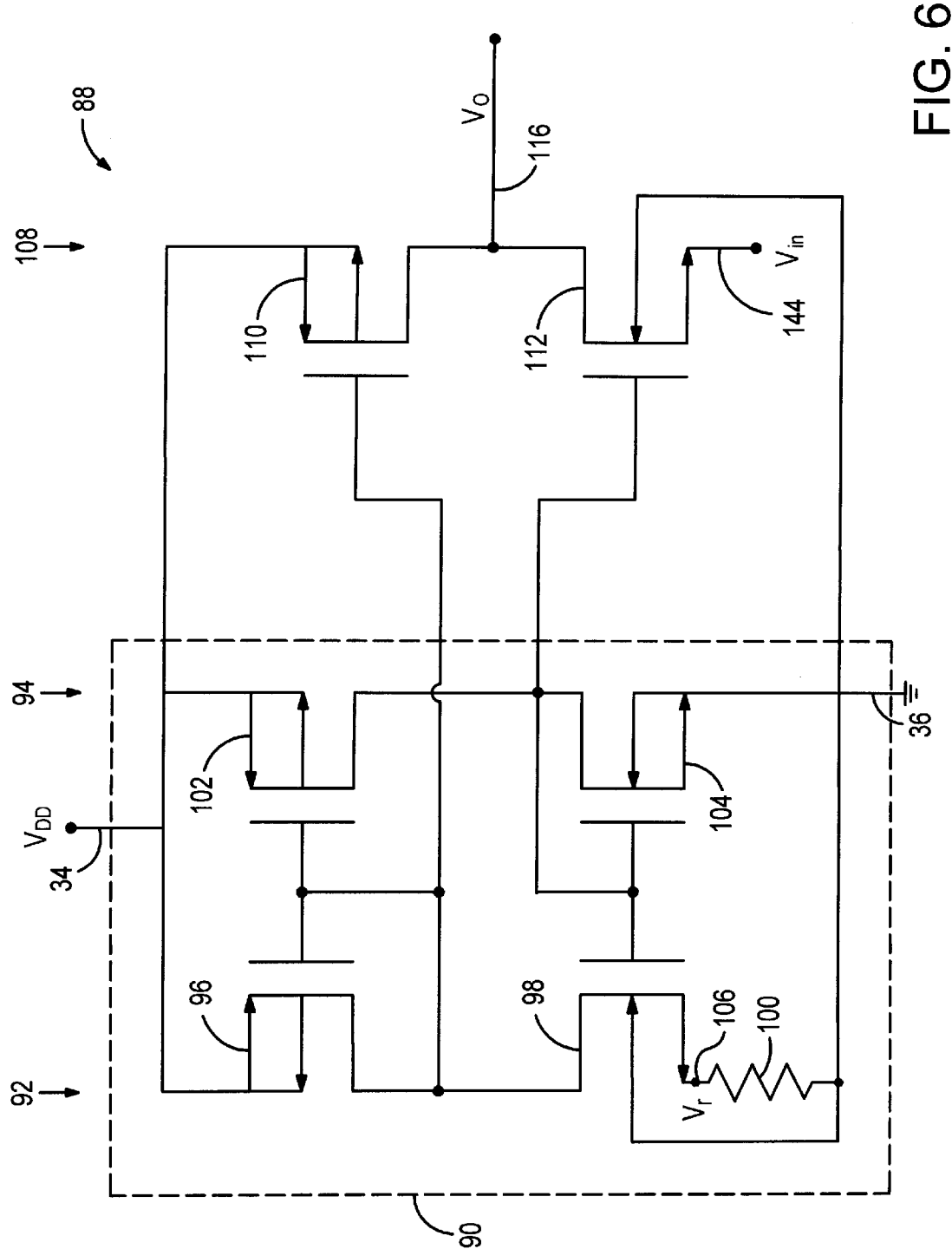
FIG. 6 is a schematic diagram of a voltage comparator in accordance with a second embodiment of the invention.

Turning to FIG. 6, a voltage comparator 88 in accordance with a second embodiment is shown. The voltage comparator 88 utilizes the fundamental concept of the voltage comparator 20 of FIG. 3. However, the voltage comparator 88 of FIG. 6 has been configured to operate for input voltages near the ground potential.

The voltage comparator 88 includes a CMOS bias network 90 that is formed by two current path 92 and 94. On the first current path 92, a PMOS transistor 96, an NMOS transistor 98 and a resistor 100 are connected in series between the high voltage terminal 34, i.e., supply voltage, and the low voltage terminal 36, i.e., electrical ground. On the second current path 94, a PMOS transistor 102 and an NMOS transistor 104 are also connected in series between the high voltage terminal and the low voltage terminal. In this embodiment, the size of the PMOS transistors 96 and 102 is the same, while the NMOS transistor 98 of the current path 92 is M times the size of the NMOS transistor 104 of the current path 94. The PMOS transistors are configured to function as a current mirror. Similar to the CMOS bias network 22 of FIG. 3, the CMOS bias network 90 preferably generates a PTAT reference voltage at node 106 on the current path 92, by operating the NMOS transistors 98 and 104 in a sub-threshold region. The resistor 100 is sized to facilitate the sub-threshold operation.

The voltage comparator 88 includes a comparison current path 108 that contains a PMOS transistor 110 and an NMOS transistor 112. The comparison current path is connected between the high voltage terminal and an input voltage terminal 114. The gate of PMOS transistor 110 is coupled to the gates of PMOS transistors 96 and 102 of the bias network 90. The PMOS transistors 96 and 110 are of the same size, so that PMOS transistor 110 will source the same amount of current as the PMOS transistor 96. The gate of NMOS transistor 112 is coupled to the gates of the NMOS transistors 98 and 104 of the bias network. The NMOS transistors 98 and 112 are also of the same size. Thus, if the $v_{gs}$ of the NMOS transistor 112 on the comparison current path 108 equals the $v_{gs}$ of the NMOS transistor 98 on the current path 92, the NMOS transistor 112 will sink the same amount of current as the NMOS transistor 98. Connected between the PMOS transistor 110 and the NMOS transistor 112 is an output terminal 116, on which the comparison signal $V_o$ is produced.

In operation, the voltage comparator 88 generates either a high or a low comparison signal $V_o$, depending on the input voltage applied to the input voltage terminal 114 on the comparison current path 108. In situations where $V_{in}$ is greater than $V_r$, the $v_{gs}$ of the NMOS transistor 112 on the comparison current path 108 will be less than the $v_{gs}$ of the NMOS transistor 98 on the first current path 92 of the CMOS bias network 90. In these situations, the NMOS transistor 112 cannot sink all of the current sourced by the PMOS transistor 110, which is fixed to source a particular amount of current. Thus, the voltage on the output terminal 116 is driven high. In situations where $V_{in}$ is less that $V_r$, the $v_{gs}$ of the NMOS transistor 110 on the comparison current path will be greater that the $v_{gs}$ of the NMOS transistor 96 on the first current path of the CMOS bias network. In such situations, the NMOS transistor 112 will sink all of the current sourced by the PMOS transistor 110. Thus, the voltage on the output terminal is driven low.

Figure 7:
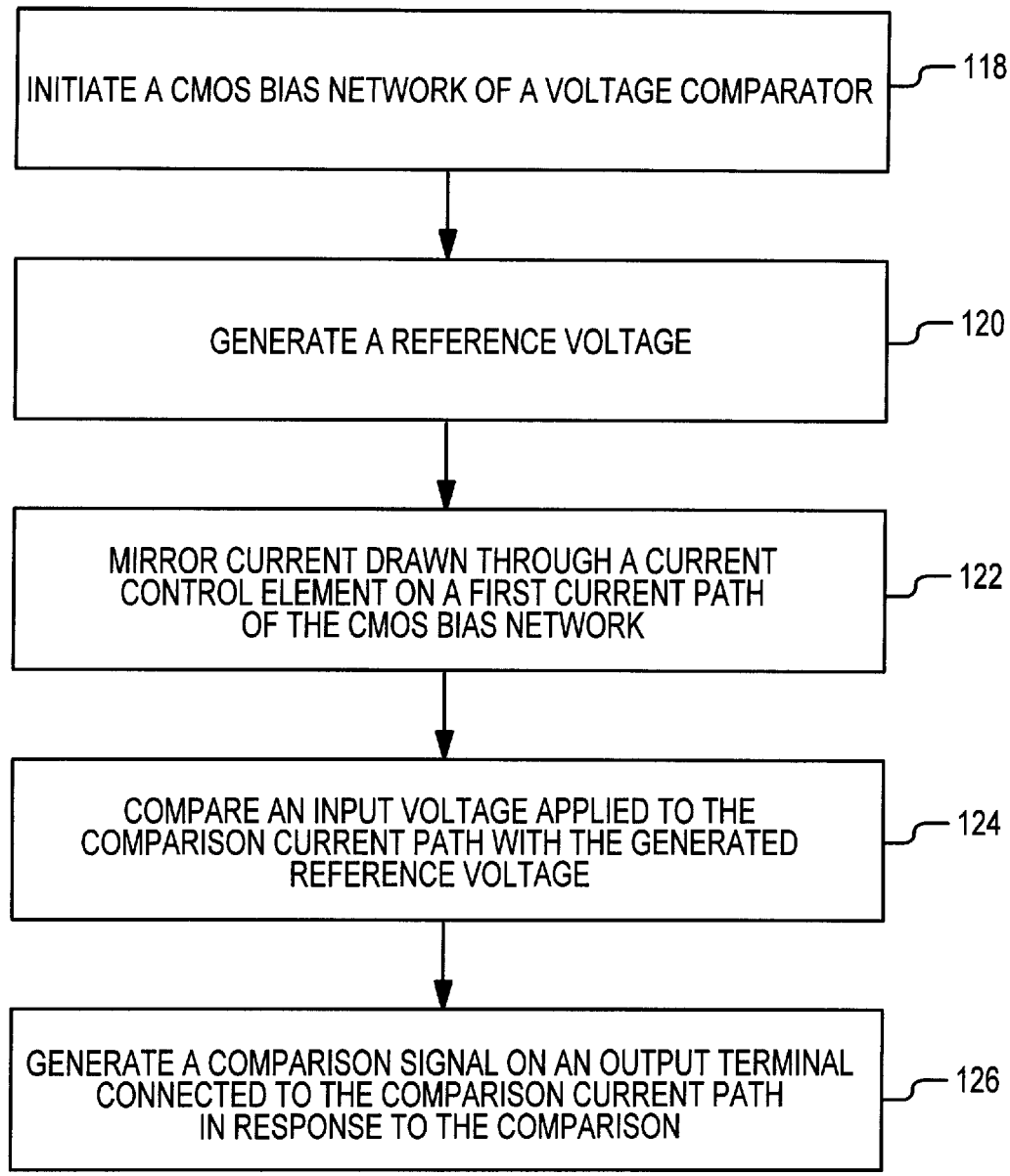
FIG. 7 is a flow diagram of a method of comparing an input voltage to an internally generated reference voltage in accordance with the invention.

A method of comparing an input voltage to an internally generated reference voltage will be described with references to the circuit 54 of FIG. 4 and the flow diagram of FIG. 7. The method begins at step 118, during which the CMOS bias network 22 of the circuit 54 is initiated. The initiation of the bias network is executed by providing voltages to the gates of PMOS transistors 26 and 30 to activate these transistors to a conducting state. During step 120, a reference voltage is generated by the bias circuit at node 42 on the first current path 38. Preferably, the PMOS transistors 26 and 30 of the bias network are operated in a sub-threshold region, so that the generated reference voltage is a PTAT voltage. During step 122, the current drawn through a current control element on the first current path 38 of the bias network, i.e., the NMOS transistor 28, is mirrored on the comparison current path 50. During step 124, an input voltage applied to the input voltage terminal 48 of the comparison current path is compared with the generated reference voltage by establishing a $v_{gs}$ on the PMOS transistor 44 of the comparison current path, which is dependent on the applied input voltage. The difference between the $v_{gs}$ of the PMOS transistor 44 on the comparison current path and the $v_{gs}$ of the PMOS transistor 26 on the first current path 38 is indicative of the difference between the input voltage and the reference voltage. In response to the $v_{gs}$ on the PMOS transistor 44 of the comparison current path, a comparison signal $V_o$ is generated on the output terminal, during step 126.

What is claimed is:

1. A circuit for comparing an input voltage to a reference voltage comprising:
    a bias network connected to a high voltage terminal and a low voltage terminal, said bias network including a first current path having a first current control element and a first transistor that are connected in series between said high voltage terminal and said low voltage terminal, said bias network being configured to generate said reference voltage on said first current path;
    a comparison current path connected between an input voltage terminal and said low voltage terminal, said comparison current path including a series connection of a comparison current control element and an active transistor, said comparison current control element and said active transistor being configured to substantially replicate conditions on said first current path of said bias network in said comparison current path when an input voltage applied to said input voltage terminal is substantially equivalent to said reference voltage generated by said bias network; and
    an output terminal connected to said comparison current path between said comparison current control element and said active transistor, said output terminal being situated to generate an output signal in response to said input voltage applied to said input voltage terminal, said output signal being dependent on said input voltage in comparison to said reference voltage generated on said first current path of said bias network.

2. The circuit of claim 1 wherein said active transistor on said comparison current path is configured such that a control electrode of said active transistor is coupled to a control electrode of said first transistor on said first current path of said bias network, said active transistor and said first transistor being substantially identical with respect to size.

3. The circuit of claim 1 wherein said first current path of said bias network includes a resistor connected in series with said first current control element and said first transistor, said resistor being configured to have an electrical resistance such that said first transistor is operated in a sub-threshold region.

4. The circuit of claim 3 wherein said bias network includes a second current path between said high voltage terminal and said low voltage terminal, said second current path including a second current control element and a second transistor that are connected in series.

5. The circuit of claim 4 wherein said first and second current control elements of said bias network are configured such that current drawn through said first current control element is substantially equivalent to current drawn through said second control element.

6. The circuit of claim 4 wherein said first transistor on said first current path of said bias network is of a size that is substantially proportional to the size of said second transistor on said second current path of said bias network.

7. The circuit of claim 4 wherein said first current control element and said first transistor of said bias network are complementary metal-oxide semiconductor (CMOS) transistors and wherein said second current control element and said second transistor of said bias network are CMOS transistors, said bias network being a CMOS bias network.

8. The circuit of claim 1 further comprising a means, operatively connected to said bias network, for electrically initiating said bias network such that said bias network is activated to a state in which current is drawn through said first current path.

9. The circuit of claim 8 wherein said means for electrically initiating said bias network is connected to said first current control element of said bias network to control said first current control element such that said first current control element is activated to a conducting state.

10. The circuit of claim 9 wherein said means for electrically initiating said bias network is connected to said first current path of said bias circuit such that said current drawn through said first current path, when said first current control element is activated, is applied to said means to deactivate said means.

11. A method of comparing an input voltage with a reference voltage using a voltage comparator comprising steps of:

generating said reference voltage on a first current path of a bias network of said voltage comparator, said first current path including a first current control element and a transistor;

mirroring current drawn through said first current control element on a comparison current path of said voltage comparator by employing a second current control element on said comparison current path;

comparing an input voltage applied to said comparison current path to said reference voltage, including establishing a voltage across a first electrode and a control electrode of an active transistor on said comparison current path by said input voltage, said voltage of said active transistor and a corresponding voltage of said first transistor on said first current path being indicative of a difference between said input voltage and said reference voltage; and outputting a comparison signal in response to said comparison of said input voltage to said reference voltage.

12. The method of claim 11 wherein said step of generating said reference voltage includes a step of operating said transistor in a sub-threshold region such that said generated reference voltage is a proportional-to-absolute-temperature (PTAT) voltage.

13. The method of claim 11 wherein said step of mirroring said current includes a step of utilizing metal-oxide semiconductor (MOS) transistors that are configured as a current mirror on said first current path and said comparison current path.

14. The method of claim 11 further comprising a step of initiating said bias network of said voltage comparator to a stable state using a startup circuit in which current is being drawn through said first current path of said bias network.

15. The method of claim 14 wherein said step of initiating said bias network includes a step of activating said first current control element of said bias network to a conducting state.

16. The method of claim 15 wherein said step of initiating said bias network further includes a step of deactivating said startup circuit after said first current control element of said bias network has been activated to said conducting state.

17. A voltage comparator comprising:

a first current path connected to a high voltage terminal and a low voltage terminal, said first current path including a series connection of a first current control element and a first transistor;

a second current path connected to said high voltage terminal and said low voltage terminal, said second current path including a series connection of a second current control element and a second transistor, said second transistor having a control electrode that is electrically coupled to a control electrode of said first transistor such that current drawn through said first transistor is substantially proportional to current drawn through said second transistor, said first and second current paths being configured to generate a reference voltage on said first current path;

a comparison current path connected to an input voltage terminal and one of said high voltage terminal and said low voltage terminal, said comparison current path including a series connection of a comparison current control element and an active transistor, said comparison control element being configured to draw current substantially equal to current drawn through said first current control element, said active transistor having a control electrode that is electrically coupled to said control electrode of said first transistor such that control voltages on said first and active transistors are substantially equivalent; and an output terminal connected to said comparison current path between said comparison current control element and said active transistor, said output terminal being situated to generate a comparison signal in response to an input voltage applied to said input voltage terminal, said comparison signal being indicative of said input voltage in comparison to said reference voltage generated on said first current path.

18. The voltage comparator of claim 17 wherein said first current path includes a resistor connected in series with respect to said first current control element and said first transistor, said first and second current paths defining a bias network that generates said reference voltage on said first current path.

19. The voltage comparator of claim 18 wherein said resistor is configured to have an electrical resistance such that said first and second transistors are operated in a sub-threshold region, said reference voltage generated by said bias network being a proportional-to-absolute-temperature voltage.

20. The voltage comparator of claim 17 wherein said first transistor, said second transistor and said active transistor are configured such that sizes of said first transistor and said active transistor are substantially same, and size of said second transistor is substantially proportional to said sizes of said first and active transistors.

21. The voltage comparator of claim 17 wherein said first, second and comparison current control elements are transistors connected in a current mirror configuration such that a substantially equal amount of current is drawn through each of said first, second and third current control elements.

22. The voltage comparator of claim 17 further comprising a startup circuit operatively coupled to said first current control element of said first current path and said second current control element of said second current path, said startup circuit being configured to activate said first and second current control elements to a conducting state so that current is drawn through said first and second current paths.

23. The voltage comparator of claim 22 wherein said startup circuit is connected to said first current path such that said current drawn through said first current path, when said first current control element is activated, is applied to said startup circuit to deactivate said startup circuit.

24. The voltage comparator of claim 22 wherein said startup circuit includes a third transistor connected to said first and second current control elements and said low voltage terminal, said third transistor being configured to selectively activate said first and second current control elements to said conducting state.

25. The voltage comparator of claim 24 wherein said startup circuit further includes a fourth transistor connected between a control electrode of said third transistor and said low voltage terminal, said fourth transistor having a control electrode that is coupled to said first current path so that said third transistor is deactivated when said fourth transistor is activated by said current drawn through said first current path.

* * * * *